United States Patent
Abdulla et al.

(10) Patent No.: US 9,887,169 B2
(45) Date of Patent: Feb. 6, 2018

(54) SIGNAL ISOLATION STRUCTURES FOR EM COMMUNICATION

(71) Applicant: Keyssa Systems, Inc., Portland, CA (US)

(72) Inventors: Mostafa Naguib Abdulla, Rancho Cordova, CA (US); Mohamed Sameh Mahmoud, Sunnyvale, CA (US); Alan Besel, Ridgefield, WA (US); Eric Sweetman, Portland, OR (US); Bojana Zivanoic, Portland, OR (US); Giriraj Mantrawadi, Portland, OR (US)

(73) Assignee: Keyssa Systems, Inc., Campbell, CA (US)

( * ) Notice: Subject to any disclaimer, the term of this patent is extended or adjusted under 35 U.S.C. 154(b) by 0 days.

(21) Appl. No.: 15/068,417

(22) Filed: Mar. 11, 2016

(65) Prior Publication Data
US 2017/0263576 A1    Sep. 14, 2017

(51) Int. Cl.
*H01Q 19/00*  (2006.01)
*H01B 5/00*  (2006.01)
*H01L 23/64*  (2006.01)
*H05K 1/18*  (2006.01)
*H04B 15/00*  (2006.01)

(52) U.S. Cl.
CPC ............. *H01L 23/64* (2013.01); *H04B 15/00* (2013.01); *H05K 1/181* (2013.01)

(58) Field of Classification Search
CPC ....................................................... H04B 15/00

USPC ............................................. 343/833; 455/41.1
See application file for complete search history.

(56) References Cited

U.S. PATENT DOCUMENTS

| | | | |
|---|---|---|---|
| 2010/0117891 A1* | 5/2010 | Utagawa | G01S 7/03 342/175 |
| 2014/0106680 A1* | 4/2014 | McCormack | H04W 12/06 455/63.1 |
| 2014/0273853 A1* | 9/2014 | Isaac | H04B 5/02 455/41.2 |
| 2015/0048907 A1* | 2/2015 | Almgren | H04B 5/0031 333/24 R |
| 2015/0085903 A1* | 3/2015 | Gundel | H05K 1/0239 375/219 |
| 2015/0111496 A1* | 4/2015 | McCormack | H04B 5/0031 455/41.1 |

* cited by examiner

*Primary Examiner* — David Vu
*Assistant Examiner* — Brandon Fox
(74) *Attorney, Agent, or Firm* — Fish & Richardson P.C.

(57) ABSTRACT

Methods, systems, and apparatus for EM isolation structures. One of the apparatus includes a communication module, the communication module including: a printed circuit board; a plurality of integrated circuit packages, each integrated circuit package including at least one transmitter, receiver, or transceiver; and one or more metallic blocking structures configured to at least partially encircle a corresponding one of the plurality of integrated circuit packages, wherein each metallic blocking structure is configured to reduce signal leakage from the corresponding integrated circuit package.

19 Claims, 7 Drawing Sheets

SIGNAL ISOLATION STRUCTURES FOR EM COMMUNICATION

BACKGROUND

This specification relates to electromagnetic communications.

Advances in semiconductor manufacturing and circuit design technologies have enabled the development and production of integrated circuits (ICs) with increasingly higher operational frequencies. In turn, electronic products and systems incorporating high frequency integrated circuits are able to provide greater functionality than previous generations of products. The additional functionality has typically included the processing of increasingly larger amounts of data at increasingly higher speeds.

Many conventional electronic systems include multiple printed circuit boards (PCBs) upon which ICs are mounted, and through which various signals are routed to and from the ICs. The need to communicate information between PCBs in electric systems with at least two PCBs have led to the development of a variety of connector and backplane architectures to facilitate information flow between PCBs. However, conventional connector and backplane architectures typically introduce a variety of impedance discontinuities into the signal path, obstructing transmission, and resulting in a degradation of signal quality or integrity. Connecting to PCBs by conventional means, e.g., signal-carrying mechanical connectors, generally creates discontinuities, requiring expensive electronics to negotiate. Conventional mechanical connectors may also wear out over time, require precise alignment and manufacturing methods, and are susceptible to mechanical jostling.

Signal isolation between different communication links is typically necessary in contactless communications to maintain signal quality. Conventional techniques for signal isolation include separation by frequency, time, code, polarization, and/or space.

SUMMARY

In general, one innovative aspect of the subject matter described in this specification can be embodied in apparatus that include a communication module, the communication module including: a printed circuit board; multiple integrated circuit packages, each integrated circuit package including at least one transmitter, receiver, or transceiver; and one or more metallic blocking structures configured to at least partially encircle a corresponding one of the multiple integrated circuit packages, wherein each metallic blocking structure is configured to reduce signal leakage from the corresponding integrated circuit package. Other embodiments of this aspect include corresponding systems and methods.

The foregoing and other embodiments can each optionally include one or more of the following features, alone or in combination. In particular, one embodiment includes all the following features in combination. The multiple integrated circuit packages include one or more transmitter integrated circuit packages, one or more receiver integrated circuit packages, or one or more transceiver integrated circuit packages. Each of the multiple integrated circuit packages are positioned on a surface of the printed circuit board and wherein the spacing between each integrated circuit package is specified based on the reduced signal leakage provided by the one or more metallic blocking structures. The one or more metallic blocking structures each form a channel for passing electromagnetic signals. One of the metallic blocking structures is shaped to direct signal propagation in a specified direction. The metallic blocking structure is shaped to partially cover a portion of the integrated circuit package. The partial coverage of the integrated circuit package provides an open channel above a transducer of the integrated circuit package. The partial coverage of the integrated circuit package is provided by an asymmetrical horn shape. The partial coverage of the integrated circuit package is provided by a symmetrical horn shape. Each signal blocking structure is configured to reduce cross-talk between integrated circuit packages.

In general, one innovative aspect of the subject matter described in this specification can be embodied in apparatus that include a communication module, the communication module including: a printed circuit board; multiple integrated circuit packages, each integrated circuit package including at least one transmitter, receiver, or transceiver; and one or more absorber structures configured to at least partially encircle a corresponding one of the multiple integrated circuit packages, wherein each absorber structure is configured to reduce signal leakage from the corresponding integrated circuit package. Other embodiments of this aspect include corresponding systems and methods.

The foregoing and other embodiments can each optionally include one or more of the following features, alone or in combination. In particular, one embodiment includes all the following features in combination. The plurality of integrated circuit packages includes one or more transmitter integrated circuit packages, one or more receiver integrated circuit packages, or one or more transceiver integrated circuit packages. Each of the multiple integrated circuit packages are positioned on a surface of the printed circuit board and wherein the spacing between each integrated circuit package is specified based on the reduced signal leakage provided by the one or more absorber structures. The communication module further comprises: multiple signal guiding structures, each signal guiding structure sounding at least a portion of a corresponding integrated circuit package. An absorber structure of the one or more absorber structures surrounds a corresponding signal guiding structure of the multiple signal guiding structures. The absorber structure has a varying thickness. The absorber structure is shaped to partially cover a portion of a corresponding integrated circuit package.

In general, one innovative aspect of the subject matter described in this specification can be embodied in apparatus that include a communication module, the communication module including multiple integrated circuit packages, each integrated circuit package including at least one transmitter, receiver, or transceiver; a housing, wherein the housing is configured to enclose a the communication module; and one or more metallic blocking structures configured to at least partially encircle a corresponding one of the multiple integrated circuit packages, wherein each metallic blocking structure is configured to reduce signal cross talk between integrated circuit packages. Other embodiments of this aspect include corresponding systems and methods.

In general, one innovative aspect of the subject matter described in this specification can be embodied in apparatus that include a communication module, the communication module including multiple integrated circuit packages, each integrated circuit package including at least one transmitter, receiver, or transceiver; a housing, wherein the housing is configured to enclose a the communication module; and one or more absorber structures configured to at least partially encircle a corresponding one of the multiple integrated circuit packages, wherein each absorber structure is configured to reduce signal leakage from the corresponding integrated circuit package. Other embodiments of this aspect include corresponding systems and methods.

The subject matter described in this specification can be implemented in particular embodiments so as to realize one or more of the following advantages. The isolation structures can reduce cross-talk between communication channels having a small separation distance. Consequently, the overall package footprint of a communication module can be minimized. Isolation structures can be used to preserve preserve frequency spectrum and avoid time-sharing, which allows for faster data transfer. The shielding against stray signals provided by the disclosed isolation structures are effective, simple, easy to integrate, and are low cost.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

Like reference symbols in the various drawings indicate like elements.

DETAILED DESCRIPTION

Figure 1:
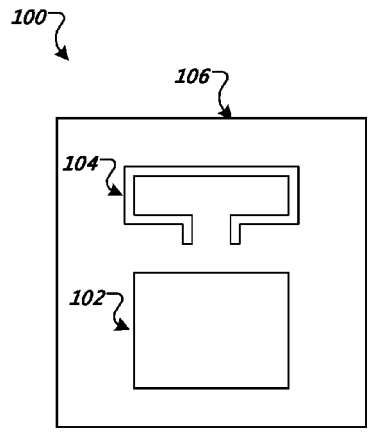
FIG. 1 is an overhead view of an example IC package.

This specification describes electromagnetic (EM) isolation structures for contactless communication. In particular, this specification describes the use of signal isolation structures to guide signals and reduce cross-talk between communication channels. This specification describes both metallic and absorber structures that can be used to isolate signals that might otherwise interfere with each other, e.g., between communication channels. The signal isolation structures are used to reduce cross talk between communication channels while minimizing the physical spacing between the channels.

Contactless communication may be used to provide signal communications between components on a device or may provide communication between devices. In one example, tightly-coupled transmitter/receiver pairs may be deployed with a transmitter disposed at a terminal portion of a first conduction path and a receiver disposed at a terminal portion of a second conduction path. The transmitter and receiver may be disposed in close proximity to each other depending on the strength of the transmitted energy, and the first conduction path and the second conduction path may not be contiguous with respect to each other. In some examples, the transmitter and receiver may be disposed on separate circuit carriers positioned with transducers (e.g., one or more antennas) of the transmitter/receiver pair in close proximity.

A transmitter, receiver, or transceiver may be configured as an integrated circuit (IC) package, in which one or more transducers may be positioned adjacent to a die and held in place by a dielectric or insulating encapsulation or bond material. A transducer may also be held in place by a lead frame substrate. Examples of transducers embedded in IC packages are shown in the drawings and described below. Note that IC packages may also be referred to as simply packages, and are examples of contactless communication units that are also variously referred to as communication units, communication devices, comm-link chips, comm-link chip assemblies, comm-link chip packages, and/or comm-link packages, which may be configured in various ways. For example, IC packages, communication units, communication devices, comm-link chips, comm-link chip assemblies, comm-link chip packages, and/or comm-link packages may each include one or more ICs, chips, or dies and have circuit functionality appropriate for particular applications.

FIG. 1 shows an example IC package 100. The IC package 100 includes a die 102 and a transducer 104 providing conversion between electrical and EM signals. The IC package 100 may include additional structures, for example, conductive connectors, such as bond wires, electrically connecting the transducer to bond pads connected to a transmitter and/or receiver circuit included in die 102. The IC package 100 further includes an encapsulating material 106 formed around at least a portion of the die 102 and/or the transducer 104. In the example IC package 100, the encapsulating material 106 completely covers the die 100 and the transducer 104.

The die 102 includes any suitable structure configured as a circuit on a suitable die substrate. In some implementations, the die can alternatively be referred to as a chip or an integrated circuit. The die substrate may be composed of any suitable semiconductor material, for example, silicon. In some implementations, the die 102 has a length and a width dimension each of substantially 1.0 mm to about 2.0 mm. The die 102 may be mounted with electrical conductors, such as a lead frame, not shown in FIG. 1, electrically coupling the die 102 to one or more external circuits. The IC package 100 can further include a transformer to provide impedance matching between a circuit on the die 102 and the transducer 104.

The transducer 104 may be in the form of a folded dipole or loop antenna and is configured to transmit and/or receive electromagnetic signals. In some implementations, the transducer 104 is configured to operate at radio frequencies including radio frequencies in the extremely high frequency (EHF) band of the electromagnetic spectrum, e.g., frequencies from 30 to 300 gigahertz. As shown in IC package 100, the transducer 104 is separate from the die 102, but is coupled to the die 102 by suitable conductors, not shown.

The dimensions of the transducer are determined such that they are suitable for operation in the specified frequency band of the electromagnetic spectrum, e.g., the EHF band.

In one example, a loop configuration of the transducer can be configured to include a substantially 0.1 mm band of material, laid out in a loop substantially 1.4 mm long and substantially 0.53 mm wide, with a gap of substantially 0.1 mm at the mouth of the loop, and with the edge of the loop approximately 0.2 mm from the edge of die 102.

The encapsulating material 106 can be used to assist in holding the various components of IC package 100 in fixed relative positions. The encapsulating material 106 may be formed from a suitable material configured to provide electrical insulation and physical protection for the components of IC package 100. Additionally, the encapsulating material 106 can be selected from a material that does not impede, or that optimizes passage of, signals to or from the transducer 104. For example, the encapsulating material 106 can be composed of glass, plastic, or ceramic. The encapsulating material 106 may also be formed in any suitable shape. For example, the encapsulating material 106 may be in the form of a rectangular block, encapsulating all components of the IC package 100 except for any unconnected ends of conductors connecting the die 102 to external circuits.

Figure 2:
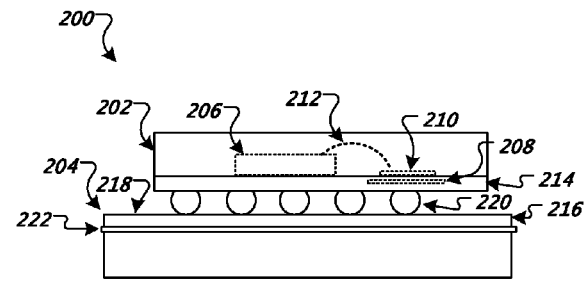
FIG. 2 shows a side view representation of an example communication device including an IC package.

FIG. 2 shows a side view representation of an example communication device 200 including an IC package 202 mounted to a PCB 204. The IC package 202 includes a die 206, a ground plane 208, a transducer 210, and one or more bond wires 212 connecting the die 206 to the transducer 210. The die 206 and transducer 210 are mounted on a package substrate 214 and encapsulated in an encapsulating material. The ground plane 208 is within the package substrate 214 and is a suitable structure configured to provide an electrical ground for the transducer 210. The ground plane 208 can extend the entire length of the package substrate 214 or just a portion, in particular, a portion underneath the transducer 210. The PCB 204 includes a top dielectric layer 216 having a surface 218. The IC package 202 is mounted to the surface 218 with mounting bumps 220 attached to a metallization pattern (not shown).

The PCB 204 also optionally includes a layer 222 spaced from dielectric layer 216 made of conductive material forming a ground plane within the PCB 204. The PCB ground plane may be any suitable structure configured to provide an electrical ground to circuits and components on the PCB 204.

Figure 3:
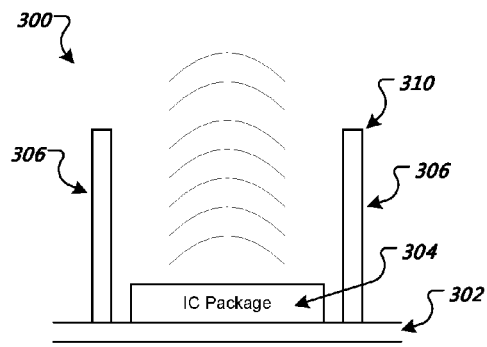
FIG. 3 is a side view of an example communication module including a signal guiding structure.

FIG. 3 is a side view of an example communication module 300 including a signal guiding structure. As shown in FIG. 3, the communication module 300 includes a PCB 302, an IC package 304, and a signal guiding structure 306 providing a signal pathway. The communication module 300, can include a transmitter or receiver for transmitting or receiving signals, e.g., radio frequency signals.

In particular, the IC package 304 can correspond to the IC packages described above with respect to FIGS. 1 and 2. The IC package 304 is mounted on the PCB 302. For example, the IC package 304 can be mounted to the PCB as described with respect to FIG. 2.

The communication module 300 can be configured to transmit or receive data using radio frequency communication. For example, if the communication module 300 includes a transmitter, the communication module 300 can transmit data, which can then be received by a receiver, e.g., of another communication module.

The signal guiding structure 306 is configured to aid in directing radio frequency (RF) signals as well as to reduce interference from spurious signals. The signal guiding structure 306 can surround a perimeter of the IC package and extend in the direction of signal transmission and/or reception by a specified amount to provide a channel for emitted or received RF signals. For example, the signal guiding structure 306 can have a height 310 suitable for a particular device including the communication module 300 and that allows the signal guiding structure 306 to be positioned in proximity to a corresponding signal guiding structure of another communication module when used to communicate with another device. The height of the signal guiding structure 306 relative to the PCB 302 can be configured such that when the communication module 300 is positioned the signal guiding structure 306 is proximal to an external device housing. The signal guiding structure can be composed of a suitable material that is configured to reduce extraneous signals without disrupting passage of communications along the channel formed by the signal guiding structure 306.

FIG. 3 illustrates one IC package 304 mounted to the PCB 302. However, in other implementations, more than one IC package can be mounted to the same PCB 302. For example, a linear array of two or more IC packages, each having a corresponding signal guiding structure, are mounted to a single PCB.

The communication module 300 can be part of a communication system of a device, e.g., a computer, mobile phone, tablet, kiosk, or other device/system. The communication system can be configured to provide contactless communication using one or more IC packages. For example, the communication system can include two IC packages, one configured as a transmitter and the other configured as a receiver. The communication system can be in communication with a storage device. Thus, for example, the communication system can transfer data between the data storage unit and an external device using contactless communication provided by the IC packages.

Figure 4:
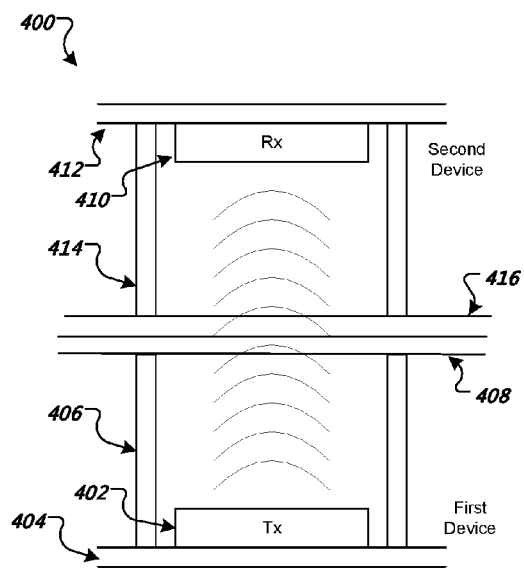
FIG. 4 is a side view diagram illustrating an example of communication between a transmitter and a receiver.

FIG. 4 is a side view diagram 400 illustrating an example of communication between a transmitter (Tx) and a receiver (Rx). For example, a user of a first device may wish to exchange data with a second device. The two devices can be positioned in proximity to each other such that the respective communication modules for transmitting and receiving data are aligned and in range of each other. In particular, for EHF frequencies, the transmitter and receiver of the two devices may need to be within specified distances. The distances can vary, for example, depending on the particular frequencies used, the materials between the transmitter and receiver, and the strength of the transmission.

In FIG. 4, a first device includes a first communication module having a transmitter IC package 402 positioned on a first PCB 404. The transmitter IC package 402 is surrounded by a first signal guiding structure 406 forming a channel. The first signal guiding structure 406 extends to a surface of a first housing 408 of the first device. For example, the first device can be a first mobile phone and the first housing 408 can correspond to the outer case of the first mobile phone.

A second device includes a second communication module having a receiver IC package 410 positioned on a second PCB 412. The receiver IC package 410 is surrounded by a second signal guiding structure 414 forming a channel. The second signal guiding structure 414 extends to a surface of a second housing 416 of the second device. For example, the second device can be a second mobile phone and the second housing 416 can correspond to the outer case of the second mobile phone. The signal guiding structures can be formed of metallic or metallic lined walls that surround the IC package 410.

As illustrated by diagram 400, the first signal guiding structure 406 and the second signal guiding structure 414 are aligned and an outer surface of the first housing 408 and the second housing 416 are in physical contact to provide optimal communication distance and interference.

A data transmission from the transmitter IC package 402 passes through the channel formed by the first signal guiding structure 406 and the second signal guiding structure 414 to the receiver IC package 410. For example, a pair of devices can communicate data between each other by transmitting data from the transmitter IC package 402 to the receiver IC package 410. The signal guiding structures along with proper alignment can maximize the power of the transmission that is received by the receiver IC package. In some implementations, the signal guiding structures can be formed from, or include a layer of, a metallic material that reflects the transmitted data along the signal guiding structures toward the receiver. In some other implementations, the signal guiding structures can be formed from, or include a layer of, an electromagnetic absorbing material to reduce stray signals that may cause interference.

Although transmitted signals from a transmitter are intended for receipt by a particular receiver, cross talk caused by leaking of signals to another channel can result in unintended coupling that interferes with communication on that other channel. With small spacing between communication channels, e.g., between integrated circuit packages, mechanical structures can be used to isolate signals that may otherwise interfere with each other. The following figures describe example structures for reducing signal leakage allowing for small spacing between communication channels.

Metallic Structures

Figure 5A:
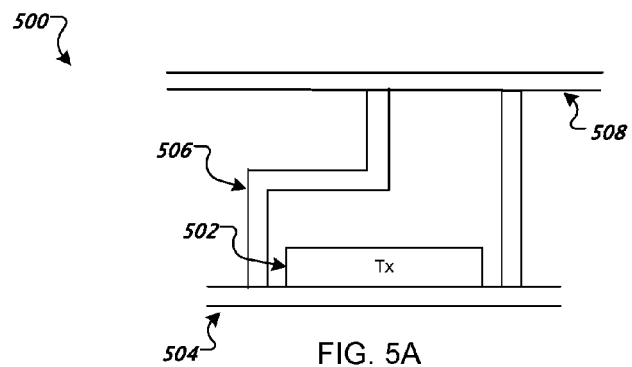
FIG. 5A shows a side view diagram illustrating a first example metallic signal isolation structure.

FIG. 5A shows a side view diagram 500 illustrating a first example metallic signal isolation structure. In particular, for ease of illustration a portion of a communication module is shown having a single integrated circuit package and positioned relative to a housing. In operation, the communication module can have one or more integrated circuit packages positioned on a common PCB. The communication module can be positioned within a device relative to a device housing such that signals can pass through the housing. The device can be positioned relative to another device to communicate data, e.g., as illustrated in FIG. 4.

As shown in diagram 500, an IC package 502, for example a transmitter IC package, is positioned on a PCB 504. The IC package 502 is at least partially encircled by a metallic outfit 506. The metallic outfit 506 forms a channel extending from the PCB 504 to a surface of a housing 508. For example, the housing 508 can be the housing portion of a device such as portion of a mobile phone case.

In some implementations, the housing portion 508 includes a portion formed from a different material than other portions of the housing portion 508. For example, the housing portion 508 can be primarily formed of a metallic material that would inhibit passage of electromagnetic signals to or from the IC package. The metallic material can also cause signals to be confined within the channel so that minimal signal energy is dissipated outside of the communication link. A portion of the housing portion 508 that is in a transmission path of signals to or from the IC package 502 can be made of a different material such as plastic that allows for transmission of the signals.

The metallic outfit 506 functions as a signal guiding structure that is configured to aid in directing radio frequency (RF) signals as well as to reduce interference from spurious signals. The metallic outfit 506 can at least partially surround a perimeter of the IC package 502 and extend in the direction of signal transmission and/or reception by a specified "height" relative to the PCB 504 to provide a channel for emitted or received RF signals.

The metallic outfit 506 can be shaped to aid in reflecting signal energy and directing signal propagation in a specified direction. In particular, the metallic outfit makes a substantially right angle after rising to a particular height above the IC package 502. From the height, the metallic outfit extends over a portion of the IC package 502 such that only a portion is open as a channel to the housing 508. Opposite the overhang, the metallic outfit forms a side wall to the housing portion 508 that is substantially perpendicular to the PCB 504. In some alternative implementations, the side walls of the metallic outfit can have a specified angle from perpendicular to the PCB 504, e.g., +/−30 degrees. The open portion can be positioned over a transducer of the IC package 502, e.g., a loop antenna. In alternative implementations, the overhanging portion of the metallic outfit can have an angle up toward the housing or down toward the IC package. Additionally, portions of the metallic outfit 506 can have a curved shape instead of linear segments.

Figure 5B:
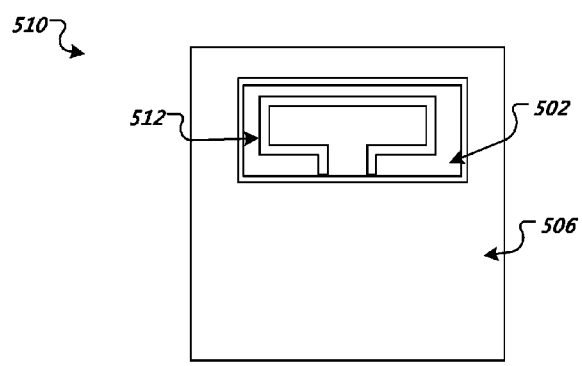
FIG. 5B shows a top view diagram illustrating the first example metallic signal isolation structure of FIG. 5A.

FIG. 5B shows a top view diagram 510 illustrating the first example metallic signal isolation structure of FIG. 5A. In particular, diagram 510 shows metallic outfit 506 covering a portion of the IC package 502, leaving a region over a transducer 512 open. Thus, the IC package 502 is mostly enclosed by the metallic outfit 506 except for the open channel portion.

Figure 6:
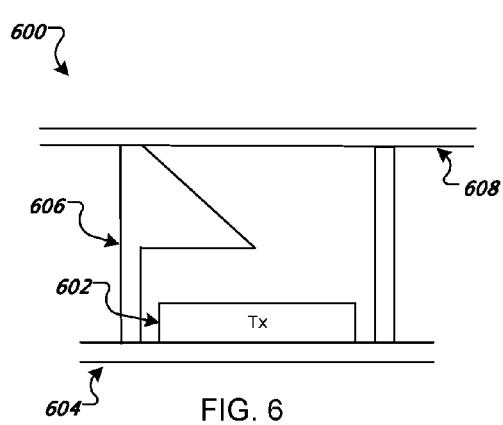
FIG. 6 shows a side view diagram illustrating a second example metallic signal isolation structure.

FIG. 6 shows a side view diagram 600 illustrating a second example metallic signal isolation structure. In particular, for ease of illustration a portion of a communication module is shown having a single integrated circuit package and positioned relative to a housing. In operation, the communication module can have one or more integrated circuit packages positioned on a common PCB. The communication module can be positioned within a device relative to a device housing such that signals can pass through the housing. The device can be positioned relative to another device to communicate data, e.g., as illustrated in FIG. 4.

As shown in diagram 600, an IC package 602, for example a transmitter IC package, is positioned on a PCB 604. The IC package 602 is at least partially encircled by a metallic outfit 606. The metallic outfit 606 forms a channel extending from the PCB 604 to a surface of a housing 608. For example, the housing 608 can be the housing portion of a device such as portion of a mobile phone case.

In some implementations, the housing portion 608 includes a portion formed from a different material than other portions of the housing portion 608. For example, the housing portion 608 can be primarily formed of a metallic material that would inhibit passage of electromagnetic signals to or from the IC package 602. A portion of the housing portion 608 that is in a transmission path of signals to or from the IC package 602 can be made of a different material such as plastic that allows for transmission of the signals.

The metallic outfit 606 functions as a signal guiding structure that is configured to aid in directing radio frequency (RF) signals as well as to reduce interference from spurious signals. The metallic outfit 606 can at least partially surround a perimeter of the IC package 602 and extend in the direction of signal transmission and/or reception by a specified "height" relative to the PCB 604 to provide a channel for emitted or received RF signals, e.g., similar to the metallic outfit 506. The metallic outfit can be used for IC packages having a transmitter as well as IC packages having a receiver. For example, the angle of the metallic horn shown in FIG. 6 can provide a more gradual transition between large (device housing side) and small apertures (side closer to the IC package). The more gradual transition, as opposed to an abrupt one, can provide better performance because discontinuities generally diffract RF energy.

The metallic outfit 606 can be shaped to aid in reflecting signal energy and directing signal propagation in a specified direction. In particular, the metallic outfit makes a substantially right angle after rising to a particular height above the IC package 602. From the height, the metallic outfit extends over a portion of the IC package 602 such that only a portion is open as a channel to the housing 608. Opposite the overhang, the metallic outfit forms a sidewall to the housing portion 608 that is substantially perpendicular to the PCB 604. The overhang forms an asymmetrical horn shape that angles back in the opposite direction and toward the housing portion 608. The open portion can be positioned over a transducer of the IC package 602. In alternative implementations, the overhanging portion of the metallic outfit can have an angle up toward the housing or down toward the IC package 602 instead of a right angle compared to the sidewall.

Figure 7:
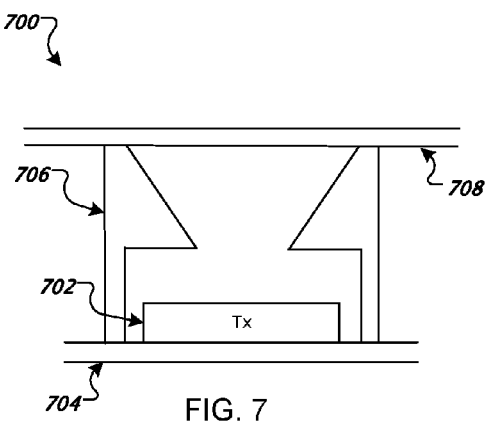
FIG. 7 shows a side view diagram illustrating a third example metallic signal isolation structure.

FIG. 7 shows a side view diagram 700 illustrating a third example metallic signal isolation structure. In particular, for ease of illustration a portion of a communication module is shown having a single integrated circuit package and positioned relative to a housing. In operation, the communication module can have one or more integrated circuit packages positioned on a common PCB. The communication module can be positioned within a device relative to a device housing such that signals can pass through the housing. The device can be positioned relative to another device to communicate data, e.g., as illustrated in FIG. 4.

As shown in diagram 700, an IC package 702, for example a transmitter IC package, is positioned on a PCB 704. The IC package 702 is at least partially encircled by a metallic outfit 706. The metallic outfit 706 forms a channel extending from the PCB 704 to a surface of a housing 708. For example, the housing 708 can be the housing portion of a device such as portion of a mobile phone case.

In some implementations, the housing portion 708 includes a portion formed from a different material than other portions of the housing portion 708. For example, the housing portion 708 can be primarily formed of a metallic material that would inhibit passage of electromagnetic signals to or from the IC package 702. A portion of the housing portion 708 that is in a transmission path of signals to or from the IC package 702 can be made of a different material such as plastic that allows for transmission of the signals.

The metallic outfit 706 functions as a signal guiding structure that is configured to aid in directing radio frequency (RF) signals as well as to reduce interference from spurious signals. The metallic outfit 706 can at least partially surround a perimeter of the IC package 702 and extend in the direction of signal transmission and/or reception by a specified "height" to provide a channel for emitted or received RF signals.

The metallic outfit 706 can be shaped to aid in reflecting signal energy and directing signal propagation in a specified direction. In particular, the metallic outfit makes a substantially right angle after rising to a particular height above the IC package 702 from at least two sides of the IC package 702. From the height, the metallic outfit extends from each respective side of one or more sides and over a portion of the IC package 702 such that only a portion is open as a channel to the housing 708. The overhang thus forms symmetrical horns that angle back in the opposite direction and toward the housing portion 708. The open portion can be positioned over a transducer of the IC package 702. In alternative implementations, the overhanging portion of the metallic outfit can have an angle up toward the housing or down toward the IC package 702.

Figure 12:
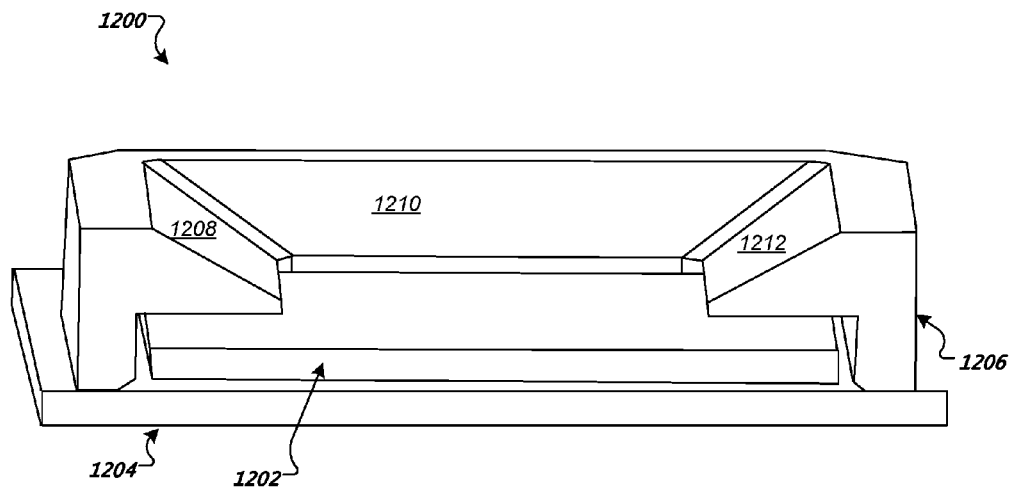
FIG. 12 shows a perspective view diagram illustrating a fourth example metallic signal isolation structure.
Figure 13:
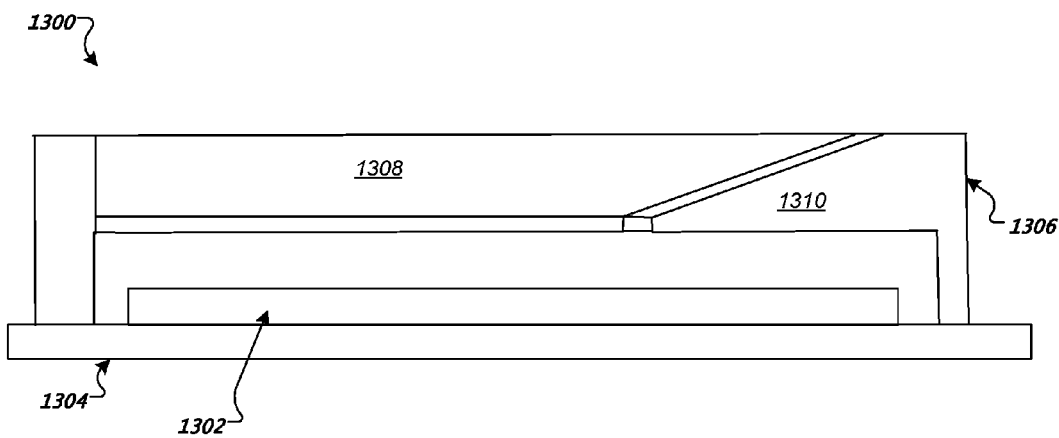
FIG. 13 shows a side view diagram illustrating a fifth example metallic signal isolation structure.

FIGS. 6 and 7 illustrate cross sections along a particular plane. However, the respective metallic outfits illustrated in the example views can include structures on other sides not illustrated by the cross-section. For example, instead of a single or double horn shape, the metallic outfit can include a horn on any number of sides surrounding the IC package. An example three sided horn metallic outfit is shown in FIG. 12. An example two sided horn metallic outfit is shown in FIG. 13.

In FIG. 12, a perspective view diagram 1200 illustrates a fourth example metallic signal isolation structure. As shown in diagram 1200, an IC package 1202, for example a transmitter IC package, is positioned on a PCB 1204. The IC package 1202 is at least partially encircled by a metallic outfit 1206. The metallic outfit 1206 forms a channel extending from the PCB 1204 to a surface of a housing (not shown).

The metallic outfit 1206 can at least partially surround a perimeter of the IC package 1202 and extend in the direction of signal transmission and/or reception by a specified "height" to provide a channel for emitted or received RF signals. The metallic outfit 1206 can be shaped to aid in reflecting signal energy and directing signal propagation in a specified direction. In particular, the metallic outfit makes a substantially right angle after rising to a particular height above the IC package 1202 from at least three sides of the IC package 1202 illustrated by portions 1208, 1210, and 1212.

From the height, the metallic outfit extends from each respective side of the three sides and over a portion of the IC package 1202 such that only a portion is open as a channel to the housing. The three overhang portions are shown as joined together forming a continuous overhang around three sides of the metallic outfit 1206. In some implementations, an overhang portion can be included on the fourth side. The overhang angles back in the opposite direction similar to the metallic outfits shown in FIGS. 6 and 7. Although straight lines and right angles are illustrated in diagram 1200, the metallic outfit 1206 can include one or more curved or angled segments in place of linear segments.

In FIG. 13, a side view diagram 1300 illustrates a fifth example metallic signal isolation structure. As shown in diagram 1300, an IC package 1302, for example a transmitter IC package, is positioned on a PCB 1304. The IC package 1302 is at least partially encircled by a metallic outfit 1306. The metallic outfit 1306 forms a channel extending from the PCB 1304 to a surface of a housing (not shown).

The metallic outfit 1306 can at least partially surround a perimeter of the IC package 1302 and extend in the direction of signal transmission and/or reception by a specified "height" to provide a channel for emitted or received RF signals. The metallic outfit 1306 can be shaped to aid in reflecting signal energy and directing signal propagation in a specified direction. In particular, the metallic outfit makes a substantially right angle after rising to a particular height above the IC package 1302 from at least three sides of the IC package 1302. However, in contrast to the metallic outfit of FIG. 7, the two sides are adjacent rather than opposite, illustrated by portions 1308 and 1310.

From the height, the metallic outfit extends from each respective side of the two adjacent sides and over a portion of the IC package 1302 such that only a portion is open as a channel to the housing. The adjacent overhangs 1308 and 1310 of the metallic outfit 1306 angle back in the opposite direction similar to the metallic outfits shown in FIGS. 6 and 7. Although straight lines and right angles are illustrated in diagram 1300, the metallic outfit 1306 can include one or more curved or angled segments in place of linear segments.

Absorber Structures

Figure 8A:
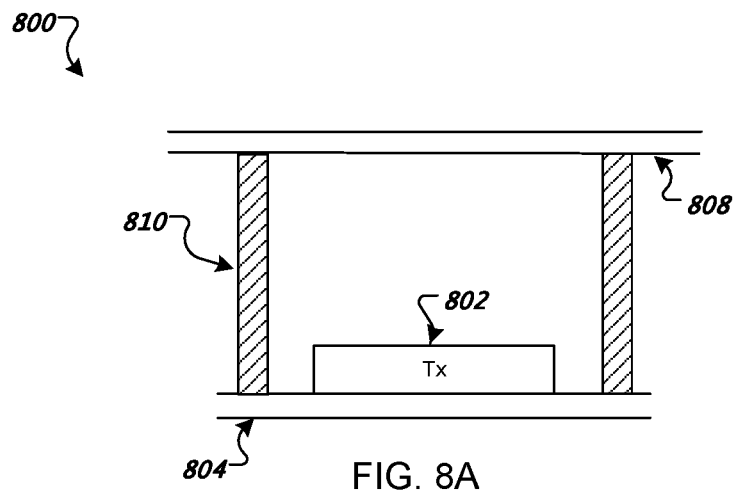
FIG. 8A shows a side view diagram illustrating a first example absorber signal isolation structure.
Figure 8B:
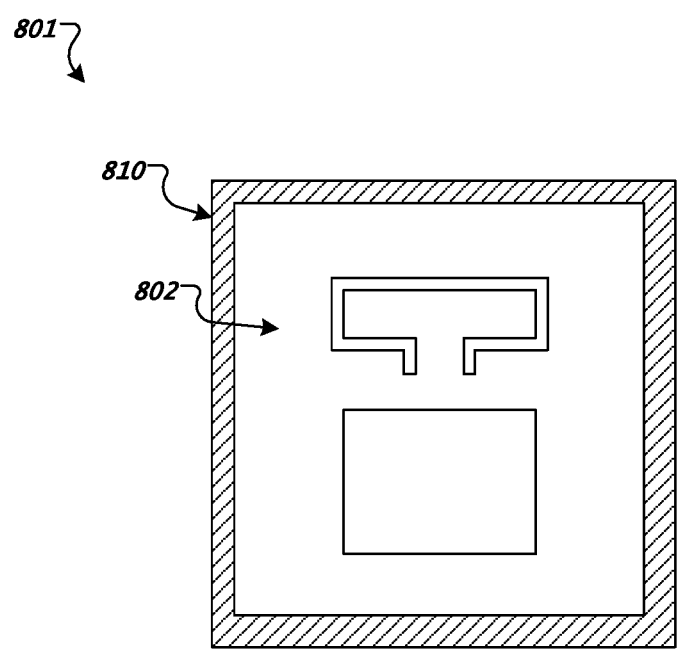
FIG. 8B shows a top view diagram illustrating the first example absorber signal isolation structure of FIG. 8A.

FIG. 8A shows a side view diagram 800 illustrating a first example absorber signal isolation structure. FIG. 8B shows a top view diagram 801 illustrating the first example absorber signal isolation structure of FIG. 8A.

In particular, for ease of illustration a portion of a communication module is shown having a single integrated circuit package and positioned relative to a housing. In operation, the communication module can have one or more integrated circuit packages positioned on a common PCB. The communication module can be positioned within a device relative to a device housing such that signals can pass through the housing. The device can be positioned relative to another device to communicate data, e.g., as illustrated in FIG. 4.

As shown in diagram 800, an IC package 802, for example a transmitter IC package, is positioned on a PCB 804. The IC package 802 is at least partially encircled by an absorbing outfit 810. The absorbing outfit 810 forms a channel extending from the IC package 802 to a surface of a housing portion 808.

The absorbing outfit 810 is configured to aid in directing radio frequency (RF) signals as well as to reduce interference from spurious signals. For example, the absorbing outfit 810 can be shaped to aid in reflecting signal energy and directing signal propagation in a specified direction. The absorbing outfit 810 can at least partially surround a perimeter of the IC package and extend in the direction of signal transmission and/or reception by a specified "height" to provide a channel for emitted or received RF signals.

The absorbing outfit 810 can be positioned relative to communication units, e.g., an IC package, to absorb signals that might otherwise cause crosstalk to adjacent channels. In some implementations, the absorbing outfit is placed around each IC package on a communication module whether it is a transmitter, or receiver.

In FIGS. 8A-8B, the absorbing outfit 810 forms an absorptive wall around the IC package 802. In particular, in the example of FIGS. 8A-B, the absorbing outfit 810 can be positioned on the PCB 804 encircling the IC package 802 and extending substantially to a surface of the housing portion 808. The absorbing outfit 810 is formed from a material that absorbs electromagnetic radiation, particularly radio frequency electromagnetic radiation including EHF RF electromagnetic radiation. For example, the absorbing outfit 810 can be composed of a silicone, epoxy or other injection-molded plastic (not silica or silicon) with ferrite or iron particle loading. In some implementations, the material is further selected based on heat tolerance properties. For example, the material can be selected based in part on a melting or deformation point in excess of temperatures generated by device components. The absorbing outfit 810 can have a thickness configured to optimize the amount of stray signal absorption and may depend on the particular absorbing material used and the proximity to another communication channel.

Figure 9A:
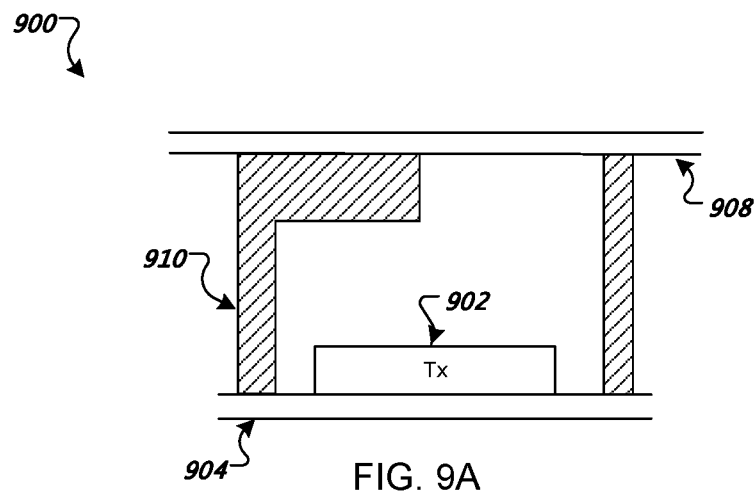
FIG. 9A shows a side view diagram illustrating a second example absorber signal isolation structure.
Figure 9B:
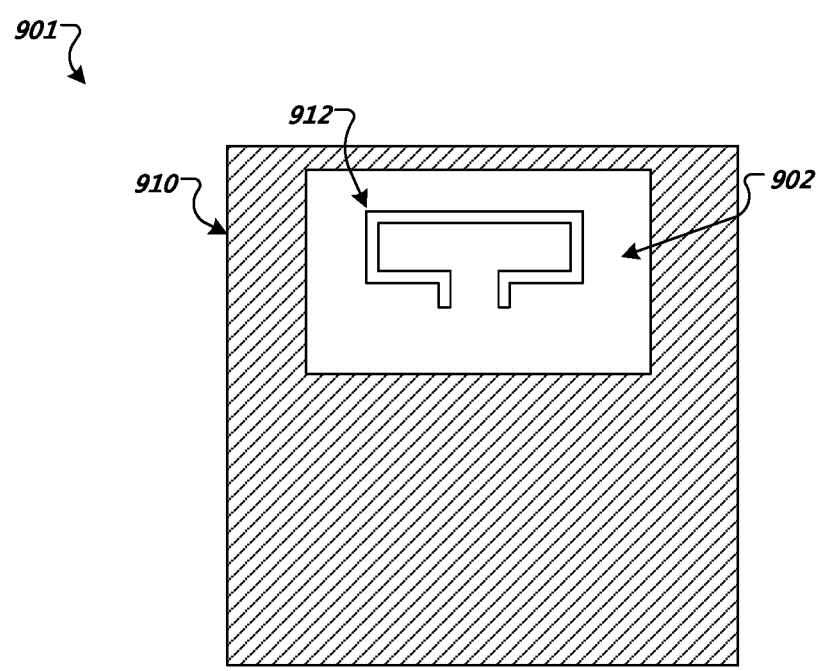
FIG. 9B shows a top view diagram illustrating the second example absorber signal isolation structure of FIG. 9A.

FIG. 9A shows a side view diagram 900 illustrating a second example absorber signal isolation structure. FIG. 9B shows a top view diagram 901 illustrating the second example absorber signal isolation structure of FIG. 9A.

For ease of illustration a portion of a communication module is shown having a single integrated circuit package and positioned relative to a housing. In operation, the communication module can have one or more integrated circuit packages positioned on a common PCB. The communication module can be positioned within a device relative to a device housing such that signals can pass through the housing. The device can be positioned relative to another device to communicate data, e.g., as illustrated in FIG. 4.

As shown in diagram 900, an IC package 902, for example a transmitter IC package, is positioned on a PCB 904. The IC package 902 is at least partially encircled by an absorbing outfit 910. The absorbing outfit 910 forms a channel extending from the IC package 902 to a surface of a housing portion 908.

The absorbing outfit 910 is configured to aid in directing radio frequency (RF) signals as well as to reduce interference from spurious signals. The absorbing outfit 910 can at least partially surround a perimeter of the IC package and extend in the direction of signal transmission and/or reception by a specified "height" to provide a channel for emitted or received RF signals.

The absorbing outfit 910 forms an absorptive wall around the IC package 902. In particular, in the example of FIGS. 9A-B, the absorbing outfit 910 is configured to form an opening for signal passage that is smaller and offset from the absorbing outfit of FIGS. 8A-8B. For example, absorbing outfit 910 can be shaped to aid in reflecting signal energy and directing signal propagation in a specified direction. In particular, the absorbing outfit 910 can makes a substantially right angle after rising to a specified height above the PCB 904 on one side of the IC package 902. From the specified height, the absorbing outfit 910 extend over a portion of the IC package 902 such that only a portion is open as a channel to the housing portion 908. Opposite the overhang, the absorbing outfit 910 forms a wall to the housing portion 908 similar to that shown in FIG. 8A-B. The open portion can be positioned over a transducer 912 (shown in FIG. 9B) of the IC package 902. In alternative implementations, the overhanging portion can have an angle up toward the housing or down toward the IC package.

The absorbing outfit 910 can be formed of a similar material to that of absorbing outfit 810 of FIGS. 8A-8B. The absorbing outfit 910 forms an opening for passage of signals. In some implementations, the edge of the opening formed by the absorbing outfit 910 is straight or may be recessed from the top surface of the absorbing outfit 910. The recess can be straight, curved, slanted, or a combination.

Figure 10A:
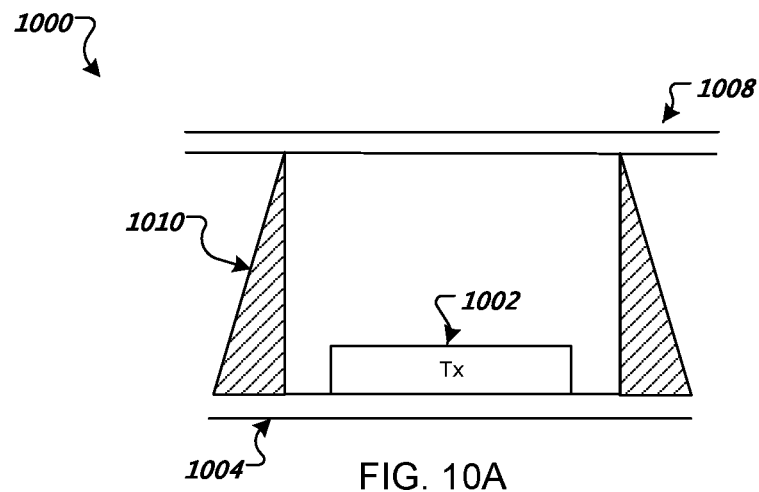
FIG. 10A shows a side view diagram illustrating a third example absorber signal isolation structure.
Figure 10B:
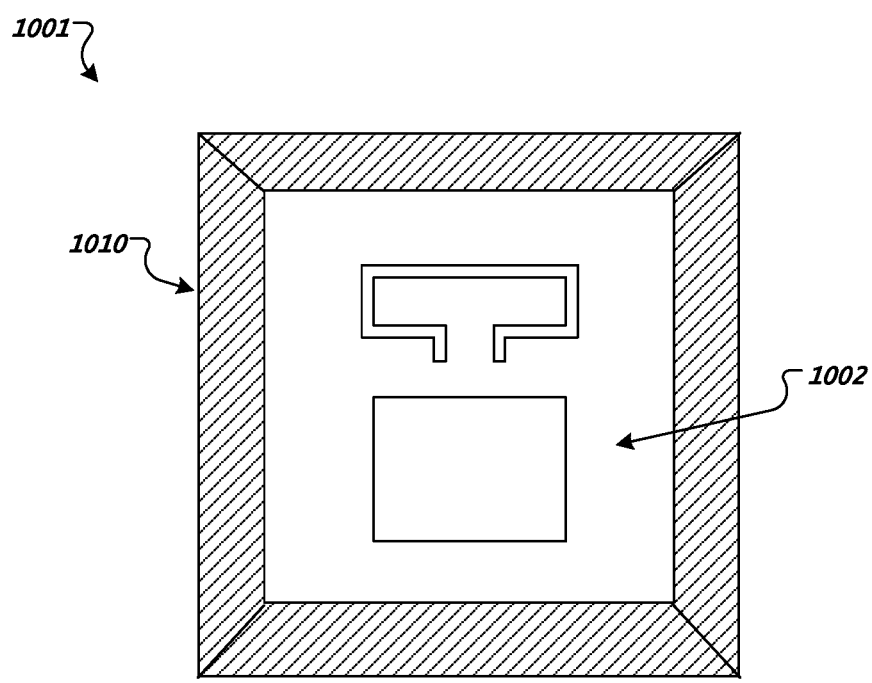
FIG. 10B shows a top view diagram illustrating the third example absorber signal isolation structure of FIG. 10A.

FIG. 10A shows a side view diagram 1000 illustrating a third example absorber signal isolation structure. FIG. 10B shows a top view diagram 1001 illustrating the third example absorber signal isolation structure of FIG. 10A.

In particular, for ease of illustration a portion of a communication module is shown having a single integrated circuit package and positioned relative to a housing. In operation, the communication module can have one or more integrated circuit packages positioned on a common PCB. The communication module can be positioned within a device relative to a device housing such that signals can pass through the housing. The device can be positioned relative to another device to communicate data, e.g., as illustrated in FIG. 4.

As shown in diagram 1000, an IC package 1002, for example a transmitter IC package, is positioned on a PCB 1004. The IC package 1002 is at least partially encircled by an absorbing outfit 1010. The absorbing outfit 1010 forms a channel extending from the IC package 1002 to a surface of a housing portion 1008.

The absorbing outfit 1010 is configured to aid in directing radio frequency (RF) signals as well as to reduce interference from spurious signals. For example, the absorbing outfit 810 can be shaped to aid in reflecting signal energy and directing signal propagation in a specified direction. The absorbing outfit 1010 can at least partially surround a perimeter of the IC package and extend in the direction of signal transmission and/or reception by a specified "height" relative to the PCB 1004 to provide a channel for emitted or received RF signals.

In FIGS. 10A-10B, the absorbing outfit 1010 forms an absorptive wall around the IC package 1002. In particular, in the example of FIGS. 10A-B, the absorbing outfit 1010 is slanted such that the thickness of the absorbing outfit 1010 is greater near the PCB 1004 than near the housing portion 1008.

The absorbing outfit 1010 is formed from a material that absorbs electromagnetic radiation, particularly radio frequency electromagnetic radiation including EHF RF electromagnetic radiation. For example, the absorbing outfit 1010 can be composed of a silica-ferrite material, e.g., a material formed by mixing small iron pieces with silicon. In some implementations, the material is further selected based on heat tolerance properties. For example, the material can be selected based in part on a melting or deformation point in excess of temperatures generated by device components. The absorbing outfit 1010 can have a thickness configured to optimize the amount of stray signal absorption and may depend on the particular absorbing material used and the proximity to another communication channel. In some other implementations, the absorbing outfit can have other shapes.

In each of the examples shown in FIGS. 8-10 above, the absorbing outfit is used without a distinct signal guiding structure and instead can act as both the absorbing outfit and signal guiding structure. However, in some implementations, the absorbing outfit of FIGS. 8-10 can be used in combination with a respective signal guiding structure that can be similar to the signal guiding structure described above, e.g., with respect to FIG. 3. For example, the absorbing outfit can surround an inner signal guiding structure that has a similar shape. When the signal guiding structure is used with the absorbing outfit, the signal guiding structure should not be formed from or coated on an interior surface with a metallic material.

Figure 11:
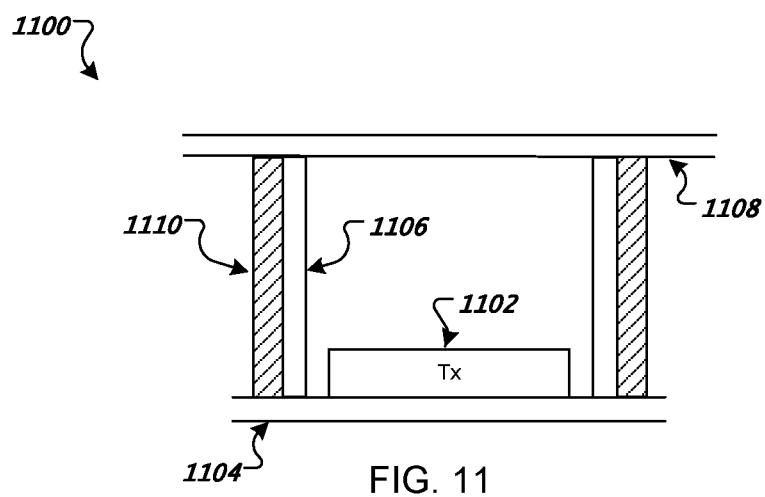
FIG. 11 shows a side view diagram illustrating a fourth example absorber signal isolation structure.

FIG. 11 shows a side view diagram 1100 illustrating a fourth example absorber signal isolation structure.

In particular, for ease of illustration a portion of a communication module is shown having a single integrated circuit package and positioned relative to a housing. In operation, the communication module can have one or more integrated circuit packages positioned on a common PCB. The communication module can be positioned within a device relative to a device housing such that signals can pass through the housing. The device can be positioned relative to another device to communicate data, e.g., as illustrated in FIG. 4.

As shown in diagram 1100, an IC package 1102, for example a transmitter IC package, is positioned on a PCB 1104. The IC package 1102 is at least partially encircled by a signal guiding structure 1106. The signal guiding structure 1106 forms a channel extending from the IC package 1102 to a surface of a housing portion 1108. The signal guiding structure, e.g., similar to signal guiding structure 306 of FIG. 3, is configured to aid in directing radio frequency (RF) signals as well as to reduce interference from spurious signals. The signal guiding structure can at least partially surround a perimeter of the IC package and extend in the direction of signal transmission and/or reception by a specified "height" to provide a channel for emitted or received RF signals. The signal guiding structure can be composed of a suitable material that is configured to reduce extraneous signals without disrupting passage of communications along the channel formed by the signal guiding structure. In particular, the signal guiding structure 1106 should not be metallic.

An absorbing outfit can be positioned relative to communication units, e.g., an IC package, to absorb signals that might otherwise cause crosstalk to adjacent channels. In some implementations, the absorbing outfit is placed around each IC package on a communication module whether it is a transmitter or a receiver. This, in combination with the signal guiding structure, provides two layers of absorptive materials for absorbing stray signals.

In FIG. 11, an absorbing outfit 1110 forms an absorptive wall around the IC package 1102. For example, the absorbing outfit 1110 can surround the signal guiding structure 1106. In particular, the absorbing outfit 1110 can be substantially parallel to the signal guiding structure 1106 and can be affixed to the signal guiding structure 1106 by a suitable affixing structure or adhesive. When viewed from above, the signal guiding structure 1106 and the absorbing outfit 1110 can form concentric squares surrounding the IC package 1102. The absorbing outfit 1110 can have a thickness configured to optimize the amount of stray signal absorption and may depend on the particular absorbing material used and the proximity to another communication channel. In some alternative implementations, the absorbing outfit is positioned on an inside layer of the signal guiding structure such that the signal guiding structure surrounds the absorbing outfit.

A number of embodiments of the invention have been described. Nevertheless, it will be understood that various modifications may be made without departing from the spirit and scope of the invention. Accordingly, other embodiments are within the scope of the following claims.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. An apparatus comprising:
   a communication module, including:
      a printed circuit board;
      one or more integrated circuit packages, each integrated circuit package including at least one transmitter, receiver, or transceiver; and
      one or more metallic blocking structures configured to at least partially encircle a corresponding one of the integrated circuit packages, wherein a first metallic blocking structure includes a first portion substantially perpendicular to the printed circuit board and extending from the printed circuit board toward a device housing and a second portion substantially parallel to the printed circuit board and partially overlapping a first integrated circuit package, and wherein each metallic blocking structure is configured to reduce signal leakage from the corresponding integrated circuit package.

2. The apparatus of claim 1, wherein the communication module includes a pair of integrated circuit packages, wherein the pair includes one transmitter integrated circuit package and one receiver integrated circuit package or a pair of transceiver integrated circuit packages.

3. The apparatus of claim 1, wherein each of the integrated circuit packages are positioned on a surface of the printed circuit board and wherein the spacing between each integrated circuit package is specified based on the reduced signal leakage provided by the one or more metallic blocking structures.

4. The apparatus of claim 1, wherein the one or more metallic blocking structures each form a channel for passing electromagnetic signals.

5. The apparatus of claim 1, wherein one of the metallic blocking structures is shaped to direct signal propagation in a specified direction.

6. The apparatus of claim 5, wherein the metallic blocking structure is shaped to partially cover a portion of the integrated circuit package.

7. The apparatus of claim 6, wherein the partial coverage of the integrated circuit package provides an open channel above a transducer of the integrated circuit package.

8. The apparatus of claim 6, wherein the partial coverage of the integrated circuit package is provided by an asymmetrical horn shape.

9. The apparatus of claim 6, wherein the partial coverage of the integrated circuit package is provided by a symmetrical horn shape.

10. The apparatus of claim 1, wherein each metallic blocking structure is configured to reduce cross-talk between integrated circuit packages.

11. An apparatus comprising:
    a communication module including:
       a printed circuit board;
       one or more integrated circuit packages, each integrated circuit package including at least one transmitter, receiver, or transceiver; and
       one or more absorber structures configured to at least partially encircle a corresponding one of the integrated circuit packages, wherein a first absorber structure includes a first portion substantially perpendicular to the printed circuit board and extending from the printed circuit board toward a housing and a second portion substantially parallel to the printed circuit board and partially overlapping at least one of the integrated circuit packages, and wherein each absorber structure is configured to reduce signal leakage from the corresponding integrated circuit package.

12. The apparatus of claim 11, wherein the communication module includes a pair of integrated circuit packages, wherein the pair includes one transmitter integrated circuit package and one receiver integrated circuit package or a pair of transceiver integrated circuit packages.

13. The apparatus of claim 11, wherein each of the integrated circuit packages are positioned on a surface of the printed circuit board and wherein the spacing between each integrated circuit package is specified based on the reduced signal leakage provided by the one or more absorber structures.

14. The apparatus of claim 11, further comprising one or more signal guiding structures distinct from the one or more absorber structures, each signal guiding structure surrounding at least a portion of a corresponding integrated circuit package, wherein an absorber structure of the one or more absorber structures surrounds a corresponding signal guiding structure of the one or more signal guiding structures.

15. The apparatus of claim 14, wherein the absorber structure has a varying thickness.

16. The apparatus of claim 11, wherein the absorber structure is shaped to partially cover a portion of a corresponding integrated circuit package.

17. An apparatus, comprising:
    a communication module including one or more integrated circuit packages, each integrated circuit package including at least one transmitter, receiver, or transceiver;
    a housing configured to enclose the communication module; and
    one or more metallic blocking structures configured to at least partially encircle a corresponding one of the integrated circuit packages, wherein a first metallic blocking structure includes a first portion substantially perpendicular to a surface of the communication module and extending from the printed circuit board toward a device housing and a second portion substantially parallel to the surface of the communication module and partially overlapping a first integrated circuit package, and wherein each metallic blocking structure is configured to reduce signal cross talk between integrated circuit packages.

18. An apparatus, comprising:
a communication module including one or more integrated circuit packages, each integrated circuit package including at least one transmitter, receiver, or transceiver;
a housing configured to enclose the communication module; and
one or more absorber structures configured to at least partially encircle a corresponding one of the integrated circuit packages, wherein a first absorber structure includes a first portion substantially perpendicular to a surface of the communication module and extending from the communication module toward the housing and a second portion substantially parallel to the surface of the communication module and partially overlapping a first integrated circuit package, and wherein each absorber structure is configured to reduce signal leakage from the corresponding integrated circuit package.

19. The apparatus of claim 18, further comprising one or more signal guiding structures distinct from the one or more absorber structures, each signal guiding structure surrounding at least a portion of a corresponding integrated circuit package.

\* \* \* \* \*